(12) United States Patent
Kozakai et al.

(10) Patent No.: US 11,081,312 B2
(45) Date of Patent: *Aug. 3, 2021

(54) METHOD OF MANUFACTURING EMITTER, EMITTER, AND FOCUSED ION BEAM APPARATUS

(71) Applicant: HITACHI HIGH-TECH SCIENCE CORPORATION, Tokyo (JP)

(72) Inventors: Tomokazu Kozakai, Tokyo (JP); Yoshimi Kawanami, Tokyo (JP); Hiroyuki Mutoh, Tokyo (JP); Yoko Nakajima, Tokyo (JP); Hironori Moritani, Tokyo (JP); Shinichi Matsubara, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/785,373

(22) Filed: Feb. 7, 2020

(65) Prior Publication Data

US 2020/0312603 A1 Oct. 1, 2020

(30) Foreign Application Priority Data

Mar. 26, 2019 (JP) .............................. JP2019-057661

(51) Int. Cl.
*H01J 37/08* (2006.01)
*H01J 37/30* (2006.01)
(Continued)

(52) U.S. Cl.
CPC .............. *H01J 37/08* (2013.01); *H01J 37/10* (2013.01); *H01J 37/3053* (2013.01);
(Continued)

(58) Field of Classification Search
CPC ........ H01J 37/08; H01J 37/10; H01J 37/3053; H01J 2237/0807; H01J 2237/3174; H01J 2237/31749
(Continued)

(56) References Cited

U.S. PATENT DOCUMENTS 10,658,143 B2 * 5/2020 Nakajima ............ H01J 37/3053
2015/0357147 A1 * 12/2015 Yasaka .................. H01J 27/024
250/396 R

FOREIGN PATENT DOCUMENTS

JP 2013200991 A 10/2013

* cited by examiner

*Primary Examiner* — Nicole M Ippolito
(74) *Attorney, Agent, or Firm* — Holland & Hart LLP (57) ABSTRACT

A method of manufacturing an emitter is disclosed. The method enables a crystal structure of the tip of the front end of the emitter to return to its original state with high reproducibility by rearranging atoms in a treatment, and enables a long lasting emitter to be attained by suppressing extraction voltage rise after the treatment. As a method of manufacturing an emitter having a sharpened needle-shape, the method includes: performing an electropolishing process for the front end of an emitter material having conductivity to taper toward the front end; and performing an etching to make the number of atoms constituting the tip of the front end be a predetermined number or less by further sharpening the front end through an electric field-induced gas etching having constantly applied voltage, while observing the crystal structure of the front end, by a field ion microscope, in a sharp portion having the front end at its apex.

6 Claims, 11 Drawing Sheets (51) Int. Cl.
*H01J 37/10* (2006.01)
*H01J 37/305* (2006.01)

(52) U.S. Cl.
CPC .................. *H01J 2237/0807* (2013.01); *H01J 2237/3174* (2013.01); *H01J 2237/31749* (2013.01)

(58) Field of Classification Search
USPC ....................... 250/423 R, 424, 423 F, 492.3
See application file for complete search history.

METHOD OF MANUFACTURING EMITTER, EMITTER, AND FOCUSED ION BEAM APPARATUS

CROSS REFERENCE TO RELATED APPLICATION

The present application claims priority to Japanese Patent Application No. 2019-057661, filed Mar. 26, 2019, the entire contents of which is incorporated herein for all purposes by this reference.

BACKGROUND OF THE INVENTION

1. Technical Field

The present disclosure relates to a method of manufacturing an emitter, an emitter, and a focused ion beam apparatus.

2. Description of the Related Art

Conventionally, a focused ion beam apparatus is known as an apparatus for performing observations, various evaluations, and analyses of a sample such as a semiconductor device, or for manufacturing a TEM lamella by taking out a fine lamella from the sample and then fixing the lamella to a sample holder.

This focused ion beam apparatus is provided with an ion source which generates ions, and then emits the generated ions as a focused ion beam (FIB).

There are several kinds of ion sources. For example, a plasma ion source or a liquid metal ion source is known, but a gas field ion source (GFIS) is known as a source capable of generating the focused ion beam having a higher luminance and smaller beam diameter than the above mentioned ion sources.

The gas field ion source primarily includes an emitter whose front end is sharpened at the atomic level, a gas source supplying gas such as helium (He) around the emitter, a cooling part for cooling the emitter, and an extraction electrode disposed in a position far from the front end of the emitter.

In such a configuration, after the gas is supplied, when extraction voltage is applied between the emitter and the extraction electrode, and the emitter is cooled, the gas is ionized by field ionization in a high electric field at a front end portion of the emitter. Thus, the gas becomes an ionized gas. In that case, gas ions are repulsed from the emitter held at an electrostatic potential and extracted toward the extraction electrode, and then converged with appropriate acceleration to generate the focused ion beam.

In particular, since the ions generated from the gas field ion source have high luminance, a small light source diameter, and small energy spread, as described above, the sample may be irradiated with a small beam diameter. Therefore, it may become possible to secure its high resolution at the time of observation and perform a fine etching process.

Meanwhile, in order to generate the focused ion beam with the small beam diameter, it is desirable to make a crystal structure of the front end of the emitter into a pyramid shape so as to arrange as few atoms as possible at tip of the front end. In this way, the gas may be ionized locally to be the gas ions, thereby making it possible to generate the focused ion beam with the small beam diameter.

Therefore, it is desirable that the above-described crystal structure is constantly and stably maintained at the front end of the emitter.

However, the crystal structure of the front end of the emitter is fragile and the crystal structure is likely to be changed from its original state. Therefore, in such a case, a method (that is, a treatment) is known, which returns the crystal structure of the front end of the emitter to its original state. Particularly, by heating the front end of the emitter to, for example, about 700° C. to 900° C., the treatment rearranges the atoms so the crystal structure is returned to its original state. Therefore, by carrying out this treatment periodically or when required, the atoms are rearranged, so that the crystal structure of the front end of the emitter returns to its original state.

A particular method of manufacturing an emitter is disclosed (see, for example, Patent Document 1). By rearranging the atoms in the treatment, the method enables the crystal structure of the tip of the front end to be returned to its original state with high reproducibility, and also enables the rise of an optimal value of the extraction voltage after the treatment to be suppressed, thereby the emitter becomes capable of being used for a long time.

Documents of Related Art (Patent Document 1) Japanese Patent Application Publication No. 2013-200991

SUMMARY OF THE INVENTION

In this respect, there is a demand to increase probe current of a focused ion beam emitted onto a sample without increasing the pressure of the gas ions. It may be achieved by making the luminance more brighter by narrowing a radiation angle of the ion beam. However, an emitter and a method of manufacturing the emitter, which is capable of narrowing the radiation angle of the ion beam while allowing a crystal structure at a front end of the emitter to return to its original state with high reproducibility, by rearranging atoms through a treatment, are not proposed in the related art.

At least one embodiment of the present disclosure is devised in view of the above situation, and aims at providing an emitter and a method of manufacturing the emitter in which by rearranging the atoms through the treatment, the crystal structure of the front end of the emitter may be returned to its original state with high reproducibility, and the radiation angle of the ion beam may be narrowed.

In order to solve the above problems and achieve the above objective, at least one embodiment of the present disclosure has adopted the following aspects.

According to one aspect of the present disclosure, a method of manufacturing an emitter includes an electropolishing process electrolytically polishing a front end portion of a conductive emitter material to taper towards a front end; and an etching process further sharpening the front end by an electric field-induced gas etching processing in a state maintaining an applied voltage constant while observing, through a field ion microscope, a crystal structure of the front end at a sharp portion with the front end as an apex to make a number of atoms constituting a tip of the front end fewer than or equal to a predetermined number.

In the method of manufacturing the emitter as described in the above first aspect, the method may further include a first etching process performing etching processing, between the electropolishing process and the etching processing, by irradiating the processed part of the emitter material with a focused ion beam to form a sharp portion with the front end as the apex.

In the method of manufacturing an emitter as described in the above first or second aspect, tungsten may be used as the emitter material.

In the method of manufacturing an emitter as described in the above first or second aspect, iridium may be used as the emitter material.

According to one aspect of the present invention, an emitter has a sharpened needle-shaped tip of a front end and the sharpened needle-shaped tip of the front end comprises a base portion having a first front end radius of curvature, a terrace portion having a second front end radius of curvature smaller than the first front end radius of curvature; and a nanopyramid with atoms arranged in a pyramid shape at an apex position of the terrace portion.

According to one aspect of the present invention, an emitter has a sharpened to needle-shaped tip of a front end, the sharpened needle-shaped tip of the front end comprises a base portion, a terrace portion in a shape of truncated cone and a nanopyramid with atoms arranged in a pyramid shape at an apex position of the terrace portion and a tip of a front end of the terrace portion in a shape of the truncated cone has a second front end of a radius of curvature smaller than the first radius of curvature of the front end at the tip of the front end of the terrace portion of the truncated cone.

In the emitter as described in the above fifth or sixth aspect, a vertex angle of the tip of the front end may be 90 degrees or more.

According to one aspect of the present invention, a focused ion beam apparatus includes: a gas field ion source having the emitter according to the above fifth to seventh aspects and an ion optics for converging ions generated from the gas field ion source.

According to the emitter and the method of manufacturing the emitter of the present invention, by rearranging the atoms through the treatment, the crystal structure of the front end of the emitter may be returned to its original state with high reproducibility, and the radiation angle of the ion beam may be narrowed.

BRIEF DESCRIPTION OF THE DRAWINGS

At least one of the above and other objects, features and advantages of the present disclosure will be more clearly understood from the following detailed description taken in conjunction with the accompanying drawings, in which.

DESCRIPTION OF THE PREFERRED EMBODIMENTS

Hereinbelow, an embodiment of the present disclosure will be described in detail below with reference to the accompanying drawings.

In the present exemplary embodiment, an emitter composing a gas field ion source (GFIS), and used as an emission source of an ion beam will be described as an example.

First, a focused ion beam apparatus provided with a focused ion beam column including the above mentioned gas field ion source is described in brief

[Configuration of Focused Ion Beam Apparatus]

Figure 1:
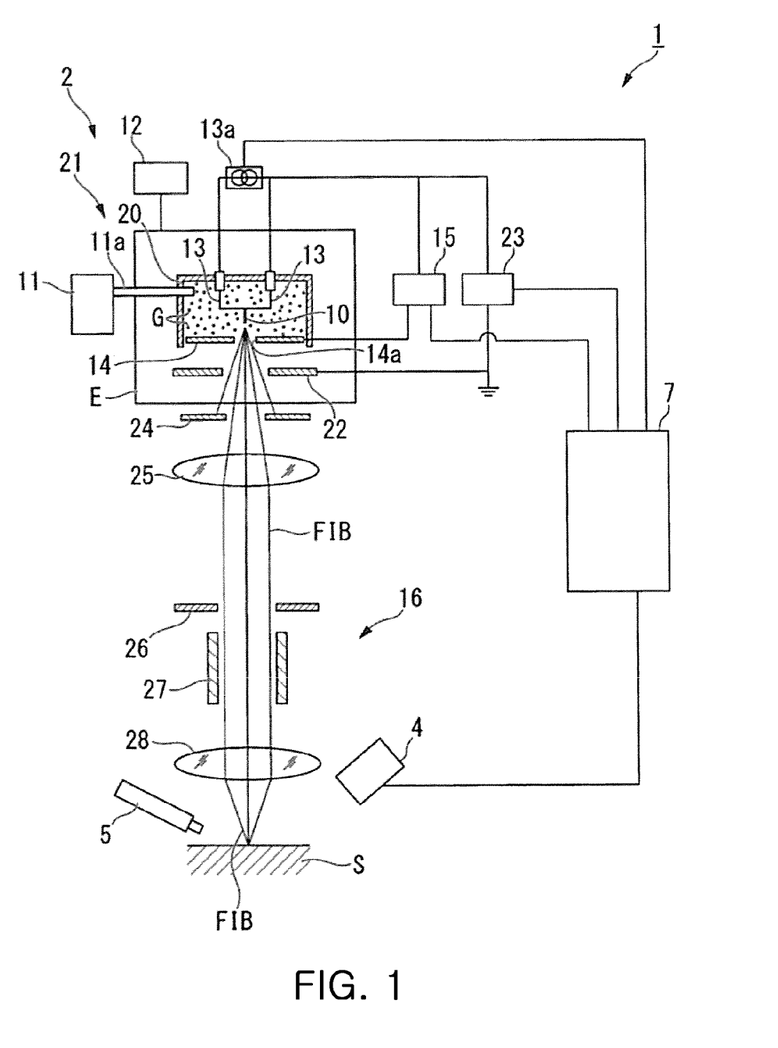
FIG. 1 is a configuration diagram of a focused ion beam apparatus according to an exemplary embodiment of the present disclosure.

FIG. 1 is a configuration diagram of a focused ion beam apparatus 1 according to an exemplary embodiment of the present disclosure.

This focused ion beam apparatus 1 includes: a focused ion beam column 2 irradiating a sample S placed on a stage ST (not shown) with a focused ion beam (FIB); a detector 4 detecting secondary charged particles generated by irradiation of the focused ion beam FIB; a gas injector 5 supplying a source gas for forming a deposition film; and a controller 7 generating image data based on the secondary charged particles detected and causing a display part (not shown) to display the image data.

The stage ST operates on the basis of an instruction of the controller 7, and the stage is capable of being displaced on five axes, for example. This enables the stage to be irradiated with the focused ion beam FIB toward a desired position by appropriately displacing the stage on the five axes. Moreover, this stage is accommodated in a vacuum chamber VC (not shown), and irradiation of the focused ion beam FIB and supply of source gas are performed in the vacuum chamber VC.

The focused ion beam column 2 includes an emitter 10, a gas source 11, a cooling part 12, a heating part 13, an extraction electrode 14, an extraction power supply part 15, and a beam optics 16.

Figure 2:
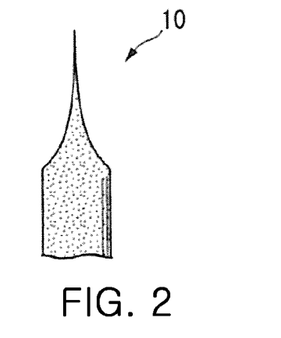
FIG. 2 is a diagram which shows an example of an external shape of the emitter of the present exemplary embodiment.

FIG. 2 is a diagram which shows an example of an external appearance of the emitter 10 of the present exemplary embodiment. As shown in this diagram, the emitter 10 is a needle-shaped conductive member having a sharpened front end (part A), and is an emission source that emits an ion beam. This emitter 10 is manufactured by a manufacturing method to be mentioned later, and the front end is sharpened at the atomic level.

Figure 3:
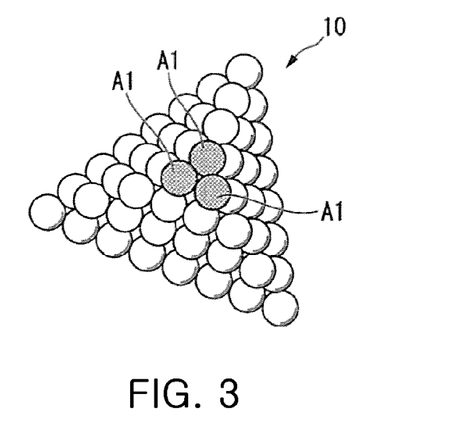
FIG. 3 is a diagram which shows an example of the atomic structure of the front end of the emitter of the present exemplary embodiment.
Figure 4:
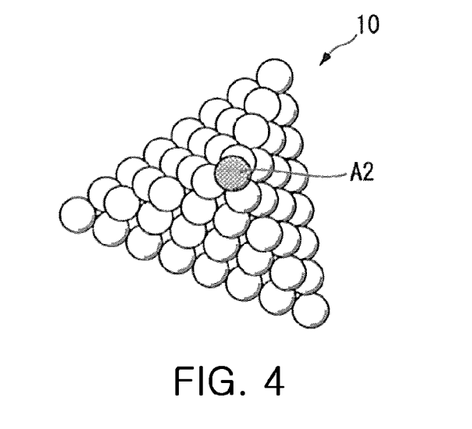
FIG. 4 is a diagram which shows another example of the atomic structure of the front end of the emitter of the present exemplary embodiment.

FIG. 3 is a diagram which shows an example of the atomic structure of the front end of the emitter 10 of the present exemplary embodiment. FIG. 4 is a diagram which shows another example of the atomic structure of the front end of the emitter 10 of the present exemplary embodiment. In detail, a crystal structure is configured to be a pyramid shape. For example, the crystal structure is configured to be a state in which three atoms A1 are arranged at the tip of the front end as shown in FIG. 3, or a state in which one atom A2 is arranged at the tip of the front end as shown in FIG. 4.

Referring to FIG. 1 again, the emitter 10 is supported in a state of being accommodated in an ion generating chamber 20 in which the inside is maintained in high vacuum.

The gas source 11 is capable of supplying a small amount of gas G, for example, helium (He) gas, around the emitter 10 via a gas introduction pipe 11a communicating with the ion generating chamber 20.

A heating part 13 locally heats the front end of the emitter 10, and the heating part is, for example, a filament. This heating unit 13 locally heats the front end of the emitter 10 to a predetermined temperature by electric current from a current source 13a operated by the instruction from the controller 7, thereby functioning to rearrange the atoms constituting the emitter 10.

In the opening of the ion generating chamber 20, an extraction electrode 14 is arranged in a state of being spaced apart from the front end of the emitter 10. An opening part 14a is provided in the extraction electrode 14 at a position opposite to the front end of the emitter 10.

An extraction power supply part 15 is an electrode that applies extraction voltage between the extraction electrode 14 and the emitter 10. By applying the extraction voltage, the extraction power supply part 15 serves to extract the gas ions toward the extraction electrode 14 after ionizing the gas G to make the gas ions at the tip of the front end of the emitter 10.

The cooling part 12 cools the emitter 10 by a coolant such as liquid helium or liquid nitrogen. In the present exemplary embodiment, the cooling part 12 cools an entire space E including the extraction electrode 14 as shown in the diagram. However, at least the emitter 10 has only to be cooled. Moreover, it is possible for a freezer to be used as a cooling method.

A gas field ion source 21 generating gas ions from the gas G is composed of the emitter 10, the gas source 11, the heating part 13, the extraction electrode 14, the extraction power supply part 15, and the ion generating chamber 20.

Further, at the lower part of the extraction electrode 14, a negative electrode 22 having a ground potential is provided. An acceleration voltage supplied from an acceleration power supply part 23 is meant to be applied between a negative electrode 22 and the emitter 10, so the extracted gas ions are energized to accelerate the ion beam. At the lower part of the negative electrode 22, a first aperture 24 narrowing the ion beam is provided. At the lower part of the first aperture 24, a condenser lens 25 focusing the ion beam to generate the focused ion beam FIB is provided.

At lower part of the condenser lens 25, a second aperture 26 being movable in the horizontal direction to further narrow the focused ion beam FIB is provided. At the lower part of the second aperture 26, a deflector 27 for scanning the focused ion beam FIB on the sample S is provided. At lower part of the deflector 27, an objective lens 28 focusing the focusing ion beam FIB on the sample S is provided.

The beam optics 16, which irradiates the sample S after making the extracted gas ions into the focused ion beam FIB, is comprised of the negative electrode 22, the acceleration power supply part 23, the first aperture 24, the condenser lens 25, the second aperture 26, the deflector 27, and the objective lens 28. In addition, although not shown, the beam optics includes an astimagsm corrector and a beam position adjusting mechanism, which is used in a conventional focused ion beam apparatus.

When the focused ion beam FIB is emitted, the detector 4 detects the secondary charged particles, emitted from the sample S, such as secondary electrons, secondary ions, reflected ions and scattering ions, so as to output to the controller 7.

The gas injector 5 is capable of supplying a compound gas, as a source gas, containing a substance (for example, phenanthrene, platinum, carbon, tungsten, or the like) to be used as a raw material of the deposition film. By irradiation of the focused ion beam FIB, and by the secondary charged particles which are generated by the irradiation, this source gas is decomposed to be separated into a gas component and a solid component. Then, the solid component out of the separated two components is deposited to provide the deposition film.

In addition, in the gas injector 5, a substance (for example, xenon fluoride, chlorine, iodine, and water) that selectively accelerates etching may be used. For example, when the sample S is a Si-based substance, xenon fluoride is used, and when the sample S is an organic-based substance, water is used. Moreover, by irradiating the substance simultaneously with the ion beam, the etching for a particular material may be performed.

While comprehensively controlling the above-described parts, the controller 7 is capable of appropriately changing the extraction voltage, the acceleration voltage, the beam current, and the like. For that reason, not only adjusting the beam diameter of the focused ion beam FIB freely and obtaining an observation image, but also locally etching the sample S (e.g. rough processing and/or finish processing) becomes possible.

In addition, the controller 7 converts the secondary charged particles detected by the detector 4 into a luminance signal to generate observation image data, and then causes the display part to output the observation image on the basis of the observation image data. Accordingly, checking the observation image becomes possible by means of the display part.

Moreover, the controller 7 is connected to an input portion (not shown) which an operator may input data, and controls each component on the basis of the signal being input by the input portion. Therefore, it is possible for the operator to irradiate a desired area with the focused ion beam FIB to by means of the input portion to observe the desired area, to etch the desired area, or to irradiate the desired area with the focused ion beam FIB while supplying source gas to the desired area so as to deposit the deposition film.

[Method of Manufacturing Emitter]

Hereinafter, a method of manufacturing an emitter 10 mentioned above is described, while referring to FIG. 5.

Figure 5:
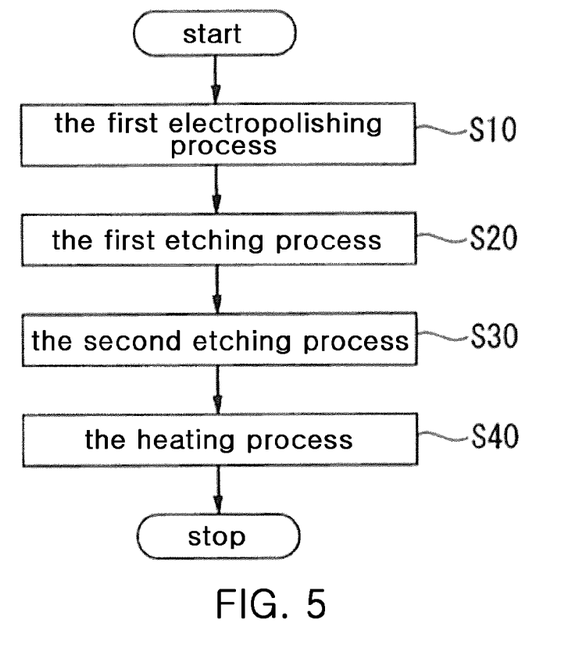
FIG. 5 is a diagram which shows an example of the method of manufacturing the emitter of the present exemplary embodiment.

FIG. 5 is a diagram which shows an example of the method of manufacturing the emitter 10 of the present exemplary embodiment.

(Step S10; Electropolishing Process)

The front end portion of the emitter material is processed by an electropolishing to be tapered toward the front end. More details will be described with reference to FIGS. 6 to 8.

Figure 6:
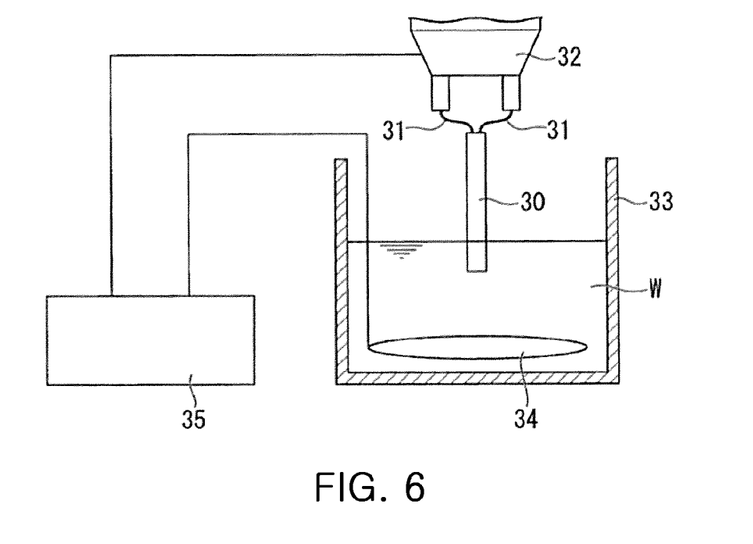
FIG. 6 is a diagram which shows a state in which the front end portion of the emitter material of the present exemplary embodiment is being processed by an electropolishing.

FIG. 6 is a diagram which shows a state in which the front end portion of the emitter material 30 of the present exemplary embodiment is being processed by the electropolishing. As the emitter material 30, for example, a wire WR made of a single crystal of tungsten may be mentioned, which has a plane of the crystal face with 111 orientation in the axial direction. The base end part of the emitter material 30 is held by a holder 32 via, for example, a fixing wire material 31.

In addition, as the emitter material 30, the wire WR having, for example, a diameter of about 0.1 mm to about 0.3 mm and a length of several mm is utilized. Also, in addition to supporting the emitter material 30, the fixing wire material 31 has a role of heating the emitter material 30 by applying electric current.

The front end portion of the emitter material 30 held by the holder 32 is immersed in polishing solution W stored in a polishing tank 33. As the polishing solution W, for example, KOH (potassium hydroxide) solution of 3 mol/L may be used. Moreover, a negative electrode 34 is disposed in a polishing tank 33.

An etching voltage (for example, DC 3V) is applied, by a voltage applying part 35, between the emitter material 30 and the negative electrode 34 for a predetermined etching time (for example, around 400 seconds) to perform the electropolishing of the front end portion of the base material 30.

Figure 7:
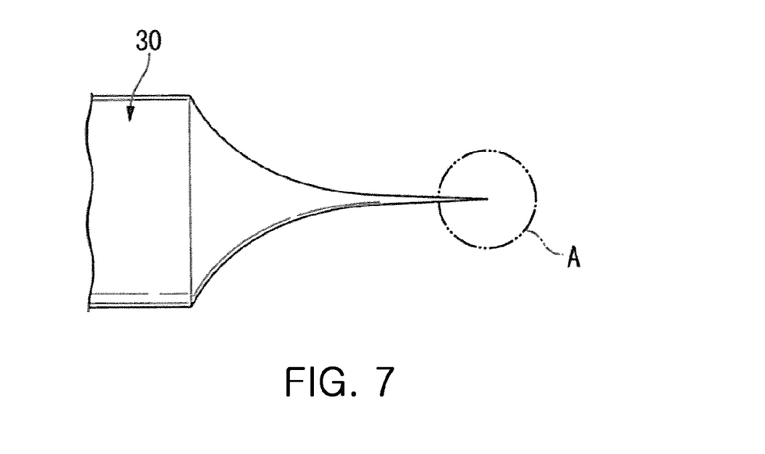
FIG. 7 is an enlarged view of the front end portion of the emitter material processed by the electropolishing process of the present exemplary embodiment.

FIG. 7 is an enlarged view of the front end portion of the emitter material 30 processed by the electropolishing process of the present exemplary embodiment. As shown in this diagram, according to the electropolishing process of the present exemplary embodiment, the front end portion of the emitter material 30 may be roughly sharpened so as to be tapered toward the front end.

Figure 8:
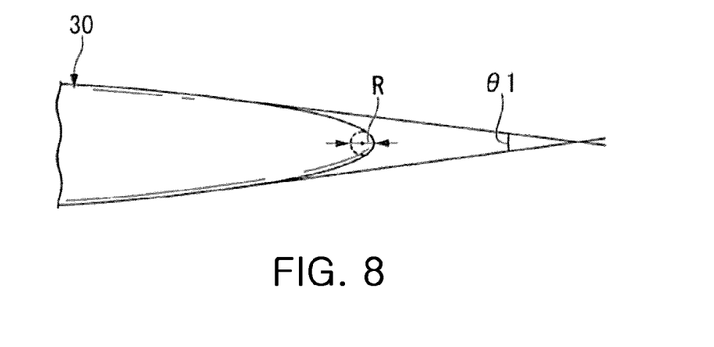
FIG. 8 is an enlarged view of a part A of the emitter material of the present exemplary embodiment.

FIG. 8 is an enlarged view of a part A of the emitter material 30 of the present exemplary embodiment. As a processing target in the electropolishing process, the electropolishing is performed until the radius of curvature R of the front end, shown in this diagram, becomes about 1 μm and the vertex angle θ1 of the front end becomes about 10 to 30 degrees.

(Step S20; First Etching Process)

After the electropolishing process is completed, the processed part of the electropolishing is irradiated with the focused ion beam FIB to perform the etching process. A detailed example of the etching process will be described with reference to FIGS. 9 and 10.

Figure 9:
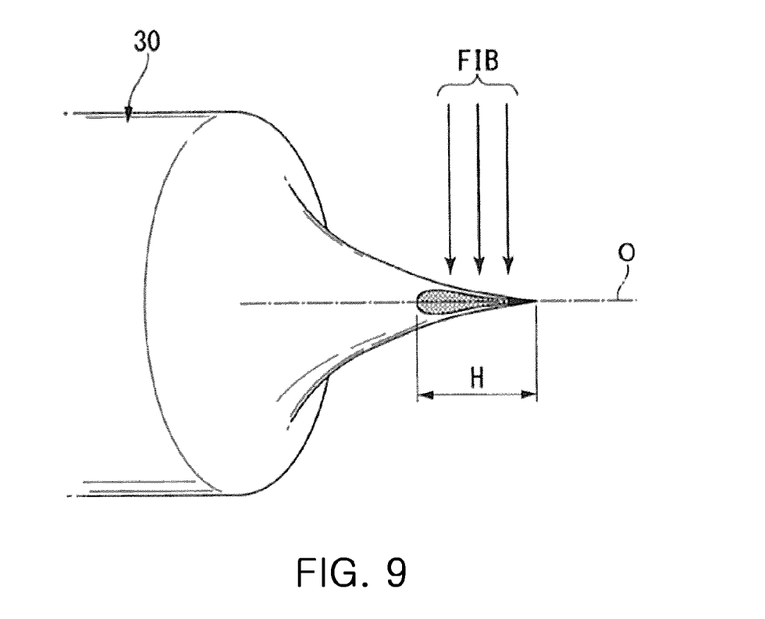
FIG. 9 is a diagram which shows a state in which the emitter material is etching-processed in the first etching process of the present exemplary embodiment.

FIG. 9 is a diagram which shows a state in which the emitter material 30 is etching-processed in the first etching process of the present exemplary embodiment.

Figure 10:
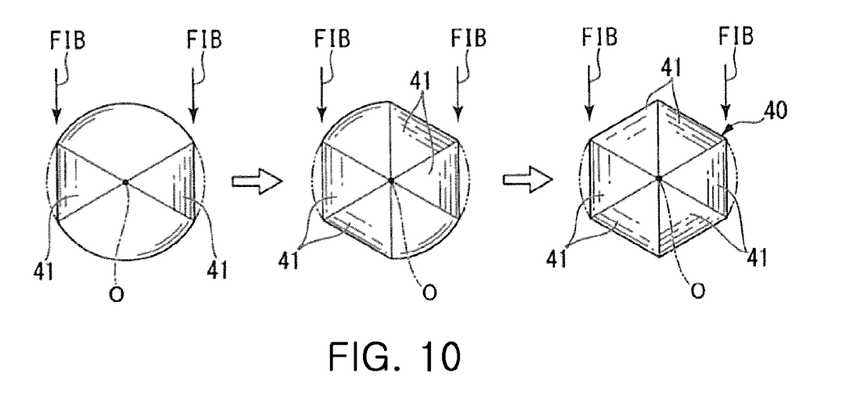
FIG. 10 is a diagram which shows an image in which the front end portion is sharpened by an etching process in the first etching process of the present exemplary embodiment.

FIG. 10 is a diagram which shows an image in which the front end portion is sharpened by the etching process in the first etching process of the present exemplary embodiment.

Over a processing region H, for example, from the front end to 50 μm in a processing part of the electropolishing, the emitter material 30 is irradiated with focused ion beam FIB while intermittently rotating the emitter material 30 around its axis O so that a sharp portion 40 with a pyramid shape is provided. In the example shown in the diagram, a pyramidal face 41 is processed, by the focused ion beam FIB, to have hexagonal planes so that the sharp portion 40 having a hexagonal pyramid shape is provided.

Figure 11:
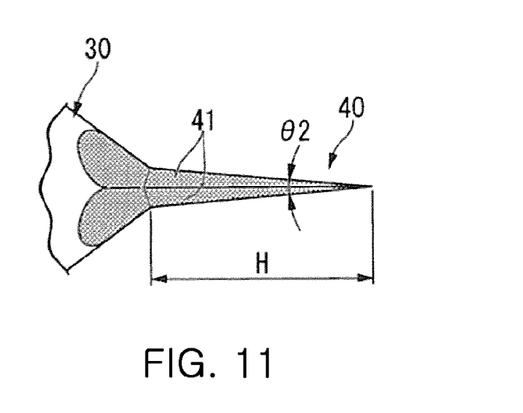
FIG. 11 is an enlarged view of a sharp portion provided in the front end portion of the emitter material by the etching process in the first etching process of the present exemplary embodiment.

At this time, as shown in FIG. 11, having the front end of the sharp portion 40 as an apex, the sharp portion 40 is finished so that the vertex angle θ2 may be 30 degrees or less.

FIG. 11 is an enlarged view of the sharp portion provided in the front end portion of the emitter material by the etching process in the first etching process of the present exemplary embodiment. In the illustrated example, the vertex angle θ2 is finished to about 25 degrees.

By this first etching process (Step S20), the sharp portion 40 having the hexagonal pyramid shape, and highly sharpened by nanometer order, may be manufactured. In particular, since the focused ion beam FIB is used, processing variations may be suppressed, and thus the sharp portion 40 may be manufactured fine in a desired shape.

(Step S30; Second Etching Process)

After completion of the first etching process (Step S20), the front end is further sharpened at the atomic level by processing of an electric field-induced gas etching while observing the crystal structure of the front end in the sharp portion 40 with a field ion microscope. This process will be described in detail with reference to FIG. 12.

Figure 12:
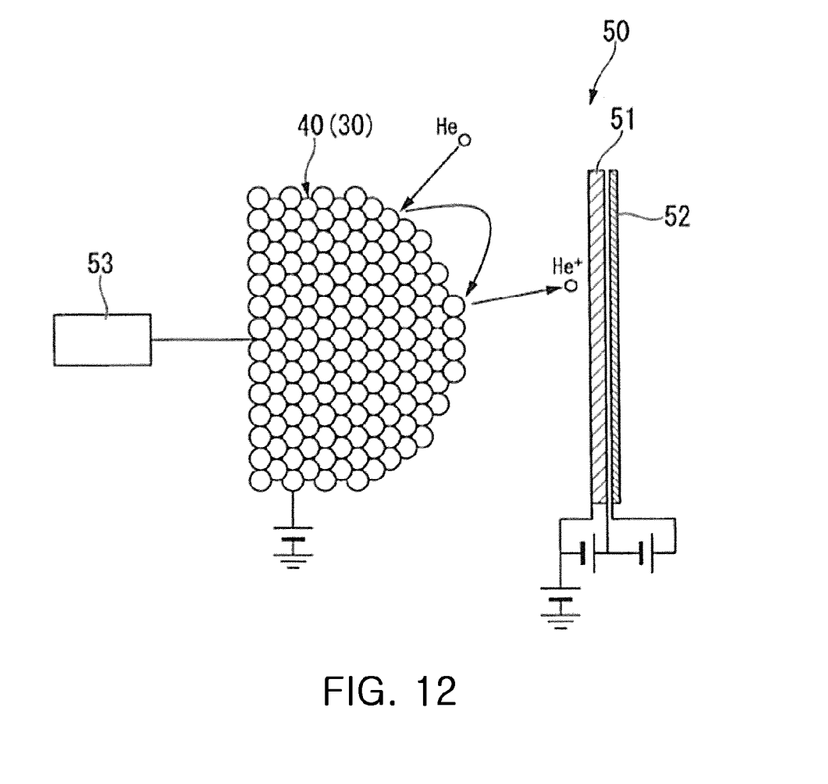
FIG. 12 is a diagram which shows a state in which the emitter material of the present exemplary embodiment is set in a field ion microscope.

FIG. 12 is a diagram which shows a state in which the emitter material 30 of the present exemplary embodiment is set in the field ion microscope. As shown in this diagram, the field ion microscope (FIM) 50 includes: a vacuum chamber (not shown) in which various gases are introduced at a predetermined pressure; an MCP (micro channel plate) 51 disposed, in the vacuum chamber, at intervals with respect to the sharp portion 40 of the emitter material 30; a fluorescent screen 52 displaying a FIM image (field ion image) of the front end of the sharp portion 40, the FIM image being amplified by the MCP 51; and a heating part 53 such as a heater for heating the emitter material 30.

In addition, in this diagram, the crystal structure in the sharp portion 40 of the emitter material 30 is shown.

In the field ion microscope 50 configured as described above, when a high voltage is applied to the emitter material 30 in the state in which an inert gas such as helium gas (He) is introduced into the vacuum chamber, the helium gas is ionized by a heavy current field in the vicinity of the atoms constituting the front end of the sharp portion 40 and moves toward the MCP 51 along the line of electric force. Then, the helium ions are converted into electrons in the MCP 51, are amplified, and then enter a fluorescent screen 52. Thereby, the FIM image of the front end of the sharp portion 40 may be projected on the fluorescent screen 52, and the crystal structure may be checked.

Here, during the observation, when a mixed gas (not shown) including oxygen, nitrogen, or both is introduced into the vacuum chamber in addition to the helium gas, the electric field-induced gas etching may be processed, in which the etching is performed by these mixed gases removing the atoms of tungsten.

Therefore, by performing this electric field-induced gas etching process, the front end of the sharp portion 40 may be cut off slowly to be sharpened at the atomic level. At this time, the sharper the tip of the front end becomes, the lower the number of atoms constituting the tip of the front end is, and thus the bright spots in the FIM image gradually decrease with time.

During the processing of the electric field-induced gas etching in the second etching process (Step S30), the high voltage applied to the emitter material 30 is maintained at fixed voltage.

By observation through the field ion microscope 50, the etching process is performed until the shape of the tip of the front end of the emitter material 30 becomes a predetermined shape. By this electric field-induced gas etching process, the most front end portion of the emitter material 30 is sharpened, and becomes a shape which is easy for field evaporation. An example of the predetermined shape of this sharp portion 40 is shown in FIG. 13.

Figure 13:
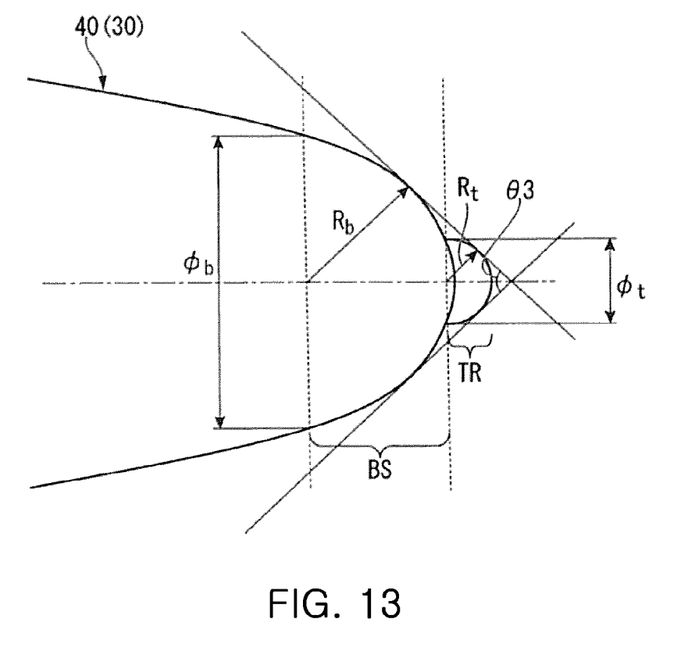
FIG. 13 is a diagram which shows an example of the shape of the sharp portion processed by an electric field-induced gas etching in the present exemplary embodiment.

FIG. 13 is a diagram which shows an example of the shape of the sharp portion 40 processed by the electric field-induced gas etching in the present exemplary embodiment. The sharp portion 40 has a base portion BS and a terrace portion TR having a hemispherical shape. The terrace portion TR is positioned at the front end of the base portion BS. The diameter $\Phi t$ of the terrace portion TR is smaller than the diameter $\Phi b$ of the base portion BS. Moreover, the radius of curvature Rt of the front end of the terrace portion TR is smaller than the radius of curvature Rb of the front end of the base portion BS. In detail, the radius of curvature Rt of the front end of the terrace portion TR is processed to be around 20 nm. The radius of curvature Rb of the front end of the base portion BS is processed to be 90 to 100 nm.

Moreover, in this second etching process, the etching is processed so that vertex angle $\theta 3$ may become 90 degrees or more. Here, the vertex angle $\theta 3$ is an angle in the cross section of the sharp portion 40 shown in this diagram between the tangent lines that are the tangent of the base portion BS and the terrace portion TR.

(Step S40; Heating Process)

Figure 14:
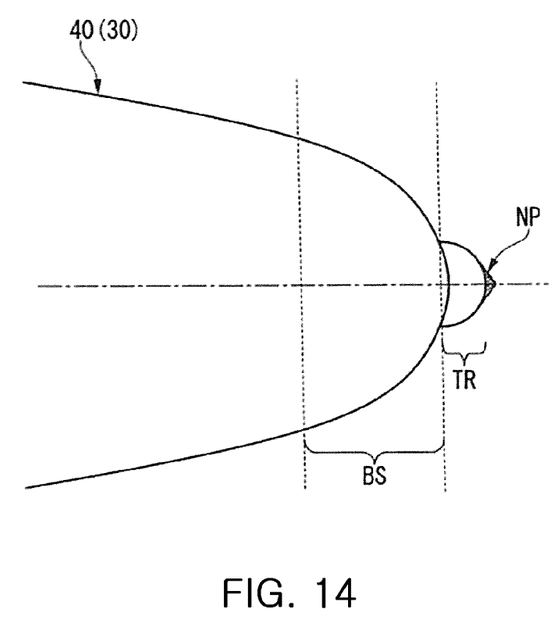
FIG. 14 is a diagram which shows an example of the shape of the tip of the front end of the sharp portion arranged in a pyramid shape of the present exemplary embodiment.

After the second etching process (Step S30) is completed, the emitter material 30 is heated to arrange the atoms constituting the tip of the front end of the sharp portion 40 in a pyramid shape. FIG. 14 shows an example of the shape of the tip of the front end of the sharp portion 40 arranged in the pyramid shape.

FIG. 14 is a diagram which shows an example of the sharp portion 40 of the tip of the front end arranged in the pyramid shape of the present exemplary embodiment. The structure of the atoms arranged in the pyramid shape constituting the tip of the front end of the sharp portion 40 is also referred to as nanopyramid NP.

In the present exemplary embodiment, this process is performed while the emitter material 30 is set in the field ion microscope 50. In particular, the helium gas and the mixed gas are discharged from the vacuum chamber, and the application of the voltage to the emitter material 30 is stopped. Afterward, the heating part 53 heats the emitter material 30 about 5 minutes at the temperature of about 700 degrees, for example.

This process enables the atoms to be arranged. In particular, since the number of atoms constituting the tip of the front end is smaller than that of the related art, these few atoms may be arranged in an ideal pyramid shape. Therefore, as shown in FIGS. 3 and 4, for example, the emitter may have the crystal structure having three atoms of A1 or one atom of A2 arranged at the tip of the front end. As a result, the atoms of the tip of the front end become such a crystal structure, and the needle-shaped emitter 10, shown in FIG. 2 and sharpened at the atomic level, may be manufactured.

In addition, after this heating process (Step S40), followed by introducing helium gas into the vacuum chamber again, when a voltage is applied to the emitter 10 to observe the FIM image, three or one bright spot may be observed. Also, the crystal structure in which three atoms A1 or one atom A2 are arranged at the tip of the front end may be observed.

According to the gas field ion source 21 including the emitter 10 manufactured as described above, the ion beam may be emitted with a small light source diameter and with high luminance. Therefore, when observing the sample S through the focused ion beam FIB using this ion beam, the sample may be observed with high resolution. Thus, when processing the sample S, processing may be performed with very fine and high precision.

In addition, since the emitter 10 manufactured as described above has a relatively large radius of curvature Rb of the front end of the base portion BS, the radiation angle of the ion beam may be made relatively small. In addition, with respect to the emitter 10 manufactured as mentioned above, an increase in emission current has been confirmed in the experiment.

For this reason, according to the gas field ion source 21 provided with the emitter 10 manufactured as mentioned above, an ion beam may be emitted with a smaller light source diameter and with higher luminance. In addition, the emission current may be increased.

In addition, when the crystal structure of the emitter 10 is changed due to the use of the gas field ion source 21, the treatment by heating is performed to rearrange the atoms. Here, at the tip of the front end, the emitter 10 of the present exemplary embodiment includes the terrace portion TR having a diameter smaller than the radius of curvature Rb of the front end of the base portion BS. For this reason, according to the emitter 10 of the exemplary embodiment, since the number of atoms which constitutes the tip of the front end as mentioned above is smaller than that of the related art, the present invention may rearrange these few atoms efficiently. Accordingly, the crystal structure may be returned to the original pyramid shape with high reproducibility. Thus, the reproduction yield by heating may be improved.

Moreover, since a few atoms may be rearranged efficiently, the heating time may also be shortened. Thus, a problem of an increased diameter of the tip end of the emitter 10 diameter may be suppressed. Therefore, compared with the conventional emitter, a rise of the optimal value of the extraction voltage after the treatment may be suppressed, and the optimal value may be kept substantially constant. As a result, the lifetime of the emitter 10 may be extended, and may be used continuously for a long time.

Here, in order to reduce the light source diameter of the ion beam and increase the luminance thereof to emit, the vertex angle $\theta 3$ at the tip of the front end of the emitter 10 is desirable to be larger. Meanwhile, when performing the treatment by heating to rearrange the atoms, in order to rearrange the atoms efficiently, the number of atoms at the tip of the front end of the emitter 10 is desirable to be smaller.

In the gas field ion source 21 of the present exemplary embodiment, since the emitter 10 is constituted by the base portion BS and the terrace portion TR, it is possible to further reduce the number of atoms at the tip of the front end of the emitter 10 while increasing the vertex angle $\theta 3$ at the tip of the front end of the emitter 10. That is, according to the gas field ion source 21 provided with the emitter 10 manufactured as described above, one characteristic represented by the reduction of the light source diameter and the high luminance of the ion beam may be compatible with the other characteristic represented by efficiency of rearranging atoms during the treatment by heating.

In addition, the above exemplary embodiment is described as an example and thus should not be construed as the limit of the scope of the present invention. These new exemplary embodiments can be implemented in other various forms, and various omissions, substitutions, and changes can be made without departing from the spirit of the present invention. These exemplary embodiments and modifications thereof are included in the scope and spirit of the present invention, and are included in the present invention and equivalent scope of the claims.

For example, in the above exemplary embodiment, the emitter 10 is described for the gas field ion source 21. However, the present invention is not limited to this case, for example, it may be sufficient for the emitter to be used as an emission source for emitting electrons to make an electron beam.

In addition, although the etching process is performed by irradiating with the focused ion beam (FIB) during the first etching process (Step S20), it is not limited to a focused ion beam. But instead, a charged particle beam may be used. For example, performing an etching process using the electron beam is also possible. Moreover, although the sharp portion 40 is formed in hexagonal pyramid shape, what is necessary is just a pyramidal shape, and the shape may be possibly formed into, for example, a triangular pyramid shape, a 12-sided pyramid shape, a 24-sided pyramid shape, and a 36-sided pyramid shape. Even in these cases, the sharp portion 40 sharpened by nanometer order may be made, so that the number of atoms which constitutes the tip of the front end may be reduced by the second etching process (Step S30) which is performed afterward.

Moreover, during a heating process (Step S40), the emitter material 30 is heated by using the field ion microscope 50 emitter material is set in preparation in the field ion microscope 50. However, for example, after the second etching step (Step S30), it is possible that the emitter material 30 may be set in the gas field ion source 21 to perform the heating process (Step S40). In this case, it is possible to immediately operate the gas field ion source 21 after the heating process (Step S40).

In addition, although tungsten is used as a material of the emitter material 30, the emitter material is not limited to this tungsten material. However, by using tungsten having a body-centered cubic structure, it is easy to arrange the atoms constituting the tip of the front end of the sharp portion 40 in an ideal pyramid shape. Moreover, since it is easy to make the high quality emitter 10 by using tungsten which is high in melting point and hardness and chemically stable, tungsten is more suitable to use as the material of the emitter.

In addition, iridium may also be used instead of tungsten, and even in this case, the same effects as with tungsten may be obtained.

Modified Embodiment

Figure 15:
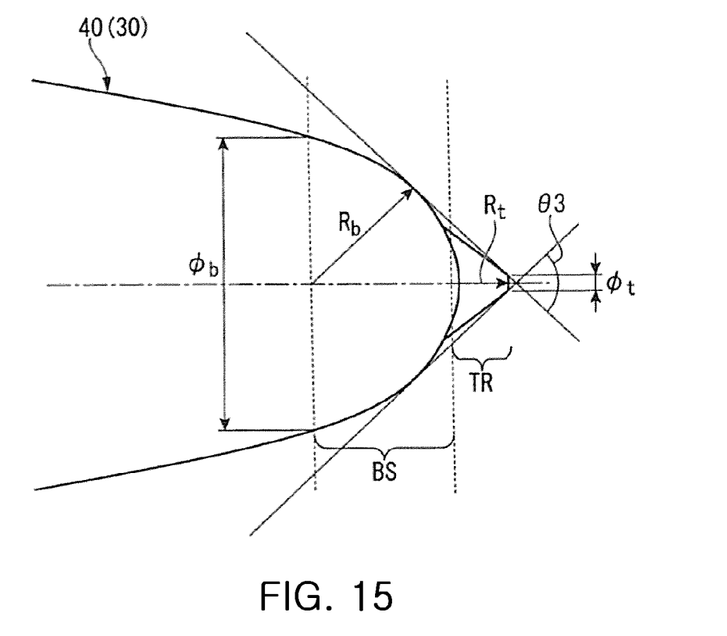
FIG. 15 is a diagram which shows another example of the shape of the sharp portion processed by the electric field-induced gas etching in the present exemplary embodiment.

FIG. 15 is a diagram which shows another example of the shape of the sharp portion processed by the electric field-induced gas etching in the present exemplary embodiment. By modifying a part of the above-described emitter manufacturing method, an emitter having a truncated cone terrace portion shown in FIG. 15 may be manufactured. The manufacturing method of the base portion is the same as that of the above example, the description is omitted.

During the processing of the electric field-induced gas etching in the second etching process (Step S30), the high voltage applied to the emitter material 30 is maintained at fixed voltage.

By observation through the field ion microscope 50, the etching process is performed until the shape of the tip of the front end of the emitter material 30 becomes a predetermined shape. An example of the predetermined shape of this sharp portion 40 is the same as that of FIG. 13. The sharp portion 40 has the base portion BS and the terrace portion TR having a hemispherical shape. The terrace portion TR is positioned at the end of front end of the base portion BS. The diameter Φt of the terrace portion TR is smaller than the diameter Φb of the base portion BS. Moreover, the radius of curvature Rt of the front end of the terrace portion TR is smaller than the radius of curvature Rb of the front end of the base portion BS. In particular, the radius of curvature Rt of the front end of the terrace portion TR is processed to be around 17 nm. The radius of curvature Rb of the front end of the base portion BS is processed to be 90 to 100 nm.

Subsequently, as shown in FIG. 15, the electric field-induced gas etching is performed so that the hemispherical terrace portion whose radius of curvature Rt of the front end is about 17 nm is processed into the truncated cone terrace portion. Up to this point, although the high voltage applied to the emitter material 30 is maintained at a constant voltage, whenever the front end of the terrace portion field-evaporates, the high voltage applied to the emitter material 30 is reduced by an appropriate voltage.

For example, assuming the high voltage applied to the emitter material 30 is V1 kV.

Assuming that when the high voltage applied to the emitter material 30 is reduced by $\Delta V1$ kV every time the front end of the terrace portion is field-evaporates by x layers, the high voltage applied to the emitter material 30 becomes $V2=V1-\Delta V1$.

Next, when the front end of the terrace portion is field-evaporates by x layers, the high voltage applied to the emitter material 30 is reduced to $V3=V2-\Delta V1$.

In addition, when the front end of the terrace portion is field-evaporates by x layers, the high voltage applied to the emitter material 30 is reduced to $V4=V3-\Delta V1$.

When this processing is repeated, the hemispherical terrace portion becomes the truncated cone by the electric field-induced gas etching. Finally, as shown in FIG. 15, the hemispherical terrace portion becomes the truncated cone terrace portion having a micro-spherical surface with a radius of curvature Rt=10 nm around the front end of the truncated cone terrace portion.

This electric field-induced gas etching stops processing when the size of the micro-spherical surface, having the radius of curvature Rt of the front end, which exists in the front end of the truncated cone terrace portion, reaches a desired size.

Moreover, in this second etching process, in the cross section of the sharp portion 40 shown in this diagram, when an angle θ3 is formed by a line connecting the tangent of the base portion BS to the edge part of the truncated cone terrace portion TR or, alternatively, an angle θ3 is formed by inclined surfaces of the truncated cone terrace portion TR integrated with the base portion BS, and when the angle θ3 is set to a vertex angle θ3, the vertex angle θ3 is processed to be 90 degrees or more.

(Step S40; Heating Process)

Figure 16:
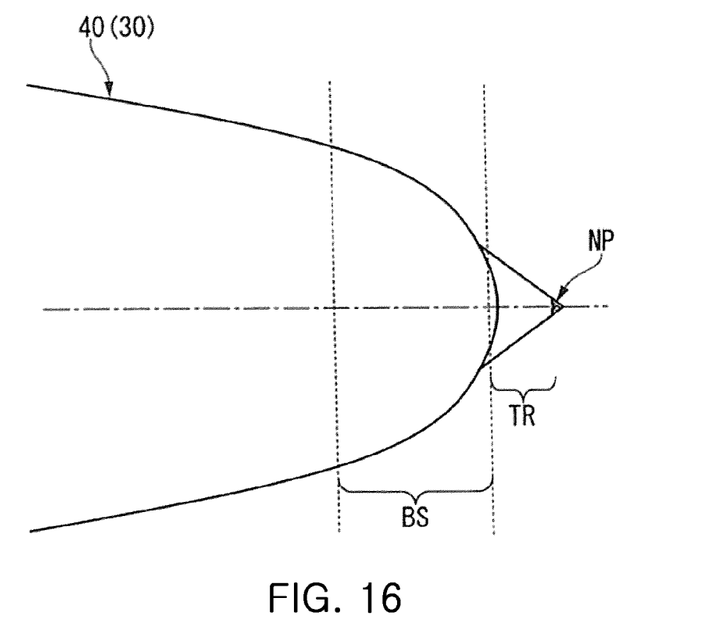
FIG. 16 is a diagram which shows another example of the shape of the tip of the front end of the sharp portion arranged in the pyramid shape of the present exemplary embodiment.

After the second etching process (Step S30) is completed, the emitter material 30 is heated to arrange the atoms constituting the tip of the front end of the sharp portion 40 in a pyramid shape. In FIG. 16, an example of the shape of the tip of the front end of the sharp portion 40 arranged in the pyramid shape is shown.

FIG. 16 is a diagram which shows another example of the shape of the tip of the front end of the sharp portion 40 arranged in the pyramid shape of the present exemplary embodiment. The structure of the atoms arranged in the pyramid shape constituting the tip of the front end of the sharp portion 40 is also referred to as nanopyramid NP. In most cases, a triangular pyramid is provided at the front end of the truncated cone terrace portion.

According to the gas field ion source 21 including the emitter 10 manufactured as described above, the ion beam may be emitted with a small light source diameter and with high luminance. Therefore, when observing the sample S through the focused ion beam FIB using this ion beam, the sample may be observed with high resolution. Also, when the sample S is processed, a very fine and high precision processing may be performed.

In addition, when the crystal structure of the emitter 10 is changed due to the use of the gas field ion source 21, the treatment by heating is performed to rearrange the atoms. Here, the emitter 10 of the present exemplary embodiment includes the terrace portion TR having the truncated cone shape at its tip of the front end. For this reason, according to the emitter 10 of the present exemplary embodiment, since the number of atoms which constitutes the tip of the front end is smaller than the above-mentioned hemispherical terrace portion, these few atoms may be rearranged more efficiently. In particular, since the terrace portion TR has the truncated cone shape, the electric field may be generated intensively in the part of the tip of the front end, in comparison with the hemispherical terrace portion. Therefore, rearrangement of the atoms may be performed without attracting impurities from the vicinity of the tip of the front end portion. Accordingly, the crystal structure may be returned to the original pyramid shape with high reproducibility. Thus, the reproduction yield by heating may be improved.

Moreover, since a few atoms may be rearranged efficiently, the heating time may be shortened and the problem of the increased diameter of the tip end of the emitter 10 may be suppressed. Therefore, compared with the conventional emitter, a rise of the optimal value of the extraction voltage after the treatment may be suppressed, and the optimal value may be kept substantially constant. As a result, the lifetime of the emitter 10 may be extended, and may be used continuously for a long time.

Here, in order to reduce the light source diameter of the ion beam and increase the luminance thereof to emit, the vertex angle θ3 at the tip of the front end of the emitter 10 is desirable to be larger. Meanwhile, when performing the treatment by heating to rearrange the atoms, in order to rearrange the atoms efficiently, the number of atoms at the tip of the front end of the emitter 10 is desirable to be smaller.

In the gas field ion source 21 of the present exemplary embodiment, since the emitter 10 is constituted by the base portion BS and the terrace portion TR, it is possible to further reduce the number of atoms at the tip of the front end of the emitter 10 while increasing the vertex angle θ3 at the tip of the front end of the emitter 10. That is, according to the gas field ion source 21 provided with the emitter 10 manufactured as described above, one characteristic represented by the reduction of the light source diameter and the high luminance of the ion beam may be compatible with the other characteristic represented by efficiency of rearranging atoms during the treatment by heating.

What is claimed is:

1. A method of manufacturing an emitter that has a sharpened needle-shape, the method comprising:
   an electropolishing process electrolytically polishing a front end portion of a conductive emitter material to taper towards the front end; and
   an etching process further sharpening the front end by an electric field-induced gas etching processing in a state maintaining an applied voltage constant while observing, through a field ion microscope, a crystal structure of the front end at a sharp portion with the front end portion as an apex to make a number of atoms constituting a tip of the front end fewer than or equal to a predetermined number.

2. The method of manufacturing an emitter of claim 1, further comprising:
   a first etching process performing etching processing, between the electropolishing process and the etching process, by irradiating the processed part of the emitter material with a focused ion beam to form a sharp portion with a front end as the apex.

3. The method of manufacturing an emitter of claim 1, wherein tungsten is used as the emitter material.

4. The method of manufacturing an emitter of claim 1, wherein tungsten is used as the emitter material.

5. The method of manufacturing an emitter of claim 1, wherein iridium is used as the emitter material.

6. The method of manufacturing an emitter of claim 2, wherein iridium is used as the emitter material.

* * * * *